United States Patent
Peak et al.

(10) Patent No.: US 8,134,709 B2
(45) Date of Patent: Mar. 13, 2012

(54) METHOD OF ALIGNING A SUBSTRATE

(75) Inventors: Jong-Sun Peak, Gyeonggi-do (KR); Young-Seok Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 631 days.

(21) Appl. No.: 12/277,346

(22) Filed: Nov. 25, 2008

(65) Prior Publication Data

US 2009/0147259 A1 Jun. 11, 2009

(30) Foreign Application Priority Data

Dec. 10, 2007 (KR) .................. 10-2007-0127622

(51) Int. Cl.
*G01B 11/00* (2006.01)
(52) U.S. Cl. .................. 356/401; 382/151; 382/141
(58) Field of Classification Search .......... 356/399–401; 382/151, 141
See application file for complete search history.

(56) References Cited

U.S. PATENT DOCUMENTS

| | | | |
|---|---|---|---|
| RE36,730 E * | 6/2000 | Nishi | 250/548 |
| 6,908,775 B2 * | 6/2005 | Heine et al. | 438/14 |
| 6,982,793 B1 | 1/2006 | Yang et al. | |
| 7,042,552 B1 * | 5/2006 | Werkman et al. | 355/55 |
| 7,184,594 B1 * | 2/2007 | Yoshida | 382/209 |
| 2006/0078192 A1 | 4/2006 | Oh et al. | |

FOREIGN PATENT DOCUMENTS

KR 1020040082893 A 9/2004

* cited by examiner

*Primary Examiner* — Gregory J Toatley
*Assistant Examiner* — Isiaka Akanbi
(74) *Attorney, Agent, or Firm* — Myers Bigel Sibley & Sajovec, P.A.

(57) ABSTRACT

In a method of aligning a substrate, a first alignment mark in a single shot region on the substrate may be identified. A second alignment mark in the single shot region may be selectively identified in accordance with the identification of the first alignment mark. The substrate may then be aligned using identified any one of the first alignment mark and the second alignment mark. Thus, although the substrate may be accurately aligned, the accurately aligned substrate may not be determined to be misaligned.

9 Claims, 8 Drawing Sheets

METHOD OF ALIGNING A SUBSTRATE

BACKGROUND

1. Field

The present invention relates generally to a method of aligning a substrate and apparatus for performing the same.

2. Description of the Related Art

Generally, various semiconductor fabricating processes may be performed on a semiconductor substrate to form a plurality of patterns. In order to identify whether the patterns may be normal or not, a process for inspecting the patterns may be performed between the semiconductor fabrication processes.

In order to inspect the patterns, it may be necessary to perform a process for accurately aligning the semiconductor substrate. The aligning process may include a process for moving the semiconductor substrate to align an alignment mark on a scribe lane of the semiconductor substrate with a reference coordinate predetermined set in an alignment apparatus.

According to a conventional aligning method, a first alignment mark in a first shot region may be identified. The identified alignment mark may then be aligned with a predetermined first coordinate. A second alignment mark in a second shot region, which may be located from the first shot region in an x-direction, may be identified. The identified second alignment mark may then be aligned with a predetermined second coordinate. A third alignment mark in a third shot region, which may be located from the first shot region in a y-direction, may be identified. The identified third alignment mark may then be aligned with a predetermined third coordinate. That is, only a single alignment mark in each of the shot regions may be aligned with the predetermined coordinate.

Meanwhile, when the alignment mark may not be identified, the alignment apparatus may determine the semiconductor substrate to be abnormal. The abnormal semiconductor substrate may be unloaded from the alignment apparatus. New alignment recipes may be set in the alignment apparatus. The above-mentioned aligning processes may then be performed on other semiconductor substrates to align the semiconductor substrates.

Here, although the alignment mark may be aligned with the predetermined coordinate, the alignment apparatus may not identify the aligned alignment mark due to an obscure image of the aligned alignment mark. According to the conventional method, the alignment apparatus may determine the semiconductor substrate having the aligned alignment mark. As a result, an alignment time of the alignment process may be too long. This may cause a low yield of semiconductor devices.

Further, only one allowable alignment score may be set as a determination standard of an alignment failure. That is, when an alignment score measured from an identified alignment mark of a semiconductor substrate may be above the allowable alignment score, the semiconductor substrate may be determined to be normally aligned. In contrast, when an alignment score measured from an identified mark of a semiconductor substrate may be below the allowable alignment score, the semiconductor substrate may be determined to be abnormally aligned. Therefore, although a semiconductor substrate may be accurately aligned, an alignment score of an alignment mark in the accurately aligned semiconductor substrate may be below the allowable alignment score due to an obscure image of the alignment mark. As a result, the accurately aligned semiconductor substrate may be determined to be abnormal.

SUMMARY

Some embodiments of the present invention provide a method of aligning a substrate that may be capable of preventing a substrate having an alignment mark, which may be accurately aligned with a predetermined coordinate, from being determined to be abnormal.

Some embodiments of the present invention also provide an apparatus for performing the above-mentioned method.

In a method of aligning a substrate in accordance with an embodiment of the present invention, a first alignment mark in a single shot region on the substrate may be identified. A second alignment mark in the single shot region may be selectively identified in accordance with the identification of the first alignment mark. The substrate may then be aligned using identified any one of the first alignment mark and the second alignment mark.

According to some embodiments of the present invention, the method may further include displaying alignment scores that may represent alignment states of the first alignment mark and the second alignment mark.

According to some embodiments of the present invention, the method may further include setting an allowable alignment score that may be used for determining non-identifications of the first alignment mark and the second alignment mark, and setting a final allowable alignment score, which may be used for finally determining non-identifications of the first alignment mark and the second alignment mark, lower than the allowable alignment score. Setting the final allowable alignment score may include changing alignment values in a descending order from the allowable alignment score to the final allowable alignment score.

According to some embodiments of the present invention, the method may further include correcting a height of the substrate.

According to some embodiments of the present invention, the first alignment mark and the second alignment mark may have substantially the same shape. Alternatively, the first alignment mark and the second alignment mark may have different shapes.

In a method of aligning a substrate in accordance with other embodiments of the present invention, any one of a first alignment mark and a second alignment mark in a first shot region on the substrate may be identified. The substrate may be primarily aligned using any one of the identified first alignment mark and the second alignment mark. Any one of a third alignment mark and a fourth alignment mark in a second shot region that may be located from the first shot region in a first direction may be identified. The substrate may be secondarily aligned using any one of the identified third alignment mark and the fourth alignment mark. Any one of a fifth alignment mark and a sixth alignment mark in a third shot region that may be located from the first shot region in a second direction substantially perpendicular to the first direction may be identified. The substrate may be tertiarily aligned using any one of the identified fifth alignment mark and the sixth alignment mark.

According to some embodiments of the present invention, identifying the first, the second, the third, the fourth, the fifth and the sixth alignment marks may include setting an allowable alignment score, which may be used for determining non-identifications of the first alignment mark, the third alignment mark and the fifth alignment mark, lower than the allowable alignment score, setting a final allowable alignment score that may be used for finally determining non-identifications of the first alignment mark, the third alignment mark and the fifth alignment mark, identifying whether a first alignment score of the first alignment mark, a third alignment score of the third alignment mark and a fifth alignment score of the fifth alignment mark may be no less than the allowable alignment score or not, identifying whether the first alignment score, the third alignment score and the fifth alignment score may be no less than the final allowable alignment score or not when the first alignment score, the third alignment score and the fifth alignment score may be below the allowable alignment score, primarily correcting a height of the substrate, identifying whether first alignment score, a third alignment score and a fifth alignment score after primarily correcting the height of the substrate may be no less than the final allowable alignment score or not, identifying whether a second alignment score of the second alignment mark, a fourth alignment score of the fourth alignment mark and a sixth alignment score of the sixth alignment mark may be no less than the allowable alignment score or not when the first alignment score, the third alignment score and the fifth alignment score after primarily correcting the height of the substrate may be below the final allowable alignment score, identifying whether the second alignment score, the fourth alignment score and the sixth alignment score may be no less than the final allowable alignment score or not when the second alignment score, the fourth alignment score and the sixth alignment score may be below the allowable alignment score, secondarily correcting the height of the substrate, identifying whether a second alignment score, a fourth alignment score and a sixth alignment score after secondarily correcting the height of the substrate may be no less than the final allowable alignment score or not.

According to some embodiments of the present invention, the first, the second, the third, the fourth, the fifth and the sixth alignment marks may have substantially the same shape. Alternatively, the first, the second, the third, the fourth, the fifth and the sixth alignment marks mark may have different shapes.

An apparatus for aligning a substrate in accordance with other embodiments of the present invention may include an identifying unit, a determining unit and an aligning unit. The identifying unit may be positioned over a stage on which the substrate may be placed. The identifying unit may identify at least two alignment marks in each of shot regions on the substrate using predetermined coordinates of alignment marks. The determining unit may determine whether the alignment mark identified by the identifying unit may be aligned or not. The aligning unit may move the stage to align the identified alignment mark with the coordinate.

According to some embodiments of the present invention, the identifying unit may include a displaying member for displaying alignment scores that may represent alignment states of the alignment marks.

According to some embodiments of the present invention, the determining unit method may include an inputting member for setting an allowable alignment score that may be used for determining non-identifications of the first alignment mark and the second alignment mark and a final allowable alignment score, which may be used for finally determining non-identifications of the first alignment mark and the second alignment mark, lower than the allowable alignment score.

According to some embodiments of the present invention, the aligning unit may include a vertical driving member for vertically moving the stage, and a horizontal driving member for horizontally moving the stage.

According to embodiments of the present invention, when the first alignment mark in the shot region may not be identified, the second alignment mark in the shot region may then be identified. Thus, although the substrate may be accurately aligned, the accurately aligned substrate may not be determined to be misaligned. Further, because the misalignment may be determined based on the two allowable alignment scores, an obscure alignment mark may not be determined to be misaligned. As a result, the accurately aligned substrate having the obscure alignment mark may be determined to be aligned, so that a time for aligning the substrate may be greatly reduced, thereby improving a yield of semiconductor devices.

BRIEF DESCRIPTION OF THE DRAWINGS

The above and other features and advantages of the present invention will become more apparent by describing in detailed example embodiments thereof with reference to the accompanying drawings in which.

DETAILED DESCRIPTION OF THE EMBODIMENTS

Figure 1:
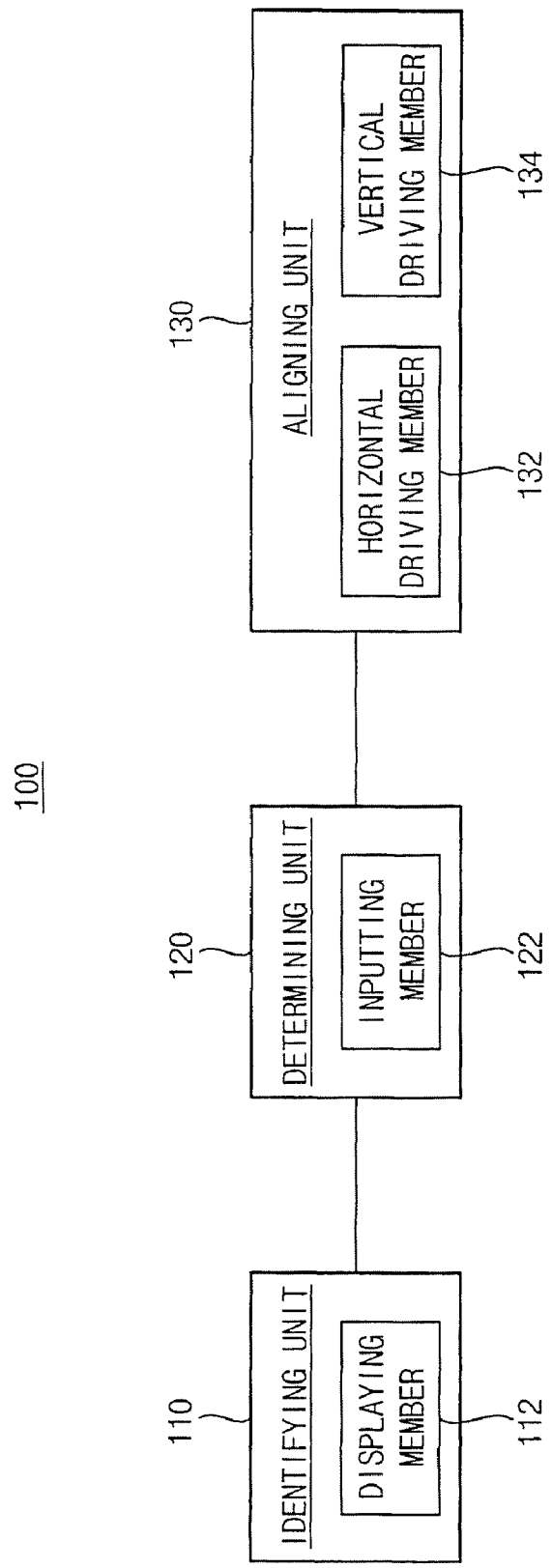
FIG. 1 is a block diagram illustrating an apparatus for aligning a substrate in accordance with some embodiments of the present invention.

This application claims priority under 35 U.S.C. §119 to Korean Patent Application No. 2007-127622 filed on Dec. 10, 2007 in the Korean Intellectual Property Office (KIPO), the contents of which are herein incorporated by reference in their entirety.

The present invention is described more fully hereinafter with reference to the accompanying drawings, in which some embodiments of the present invention are shown. The present invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing some embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized example embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Apparatus for Aligning a Substrate

Figure 2:
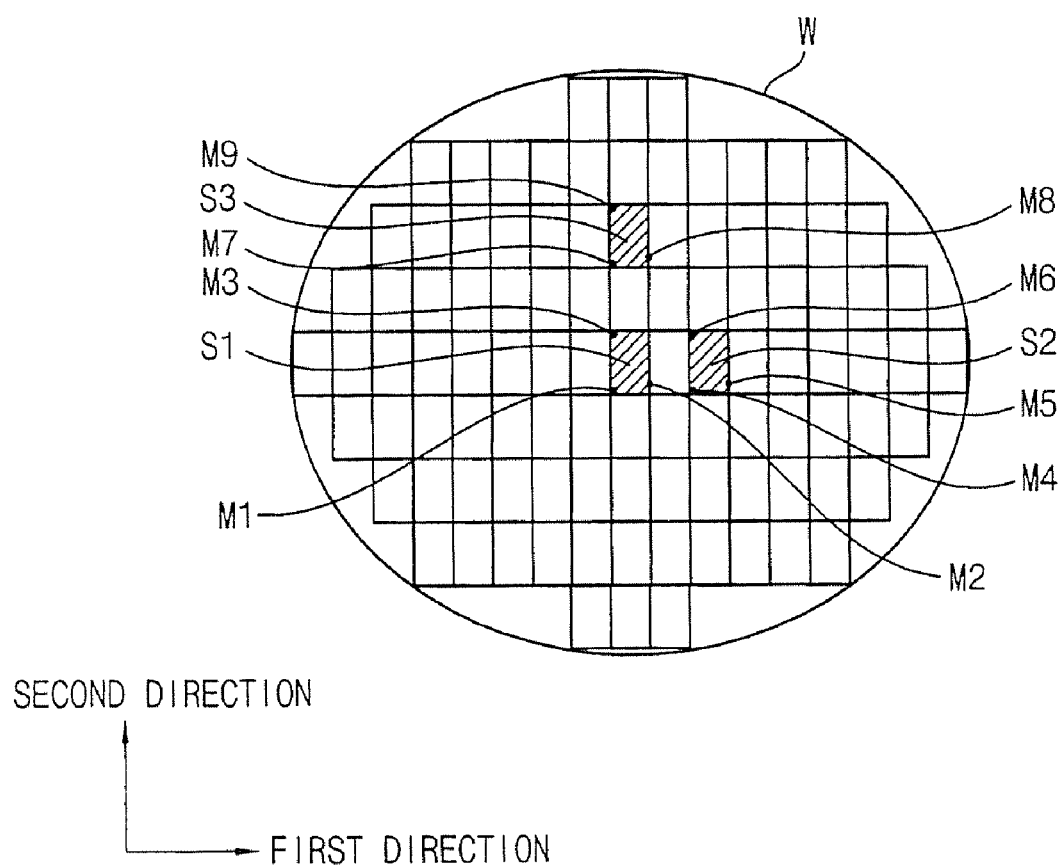
FIG. 2 is a plan view illustrating a substrate on which positions of alignment marks are displayed.
Figure 3:
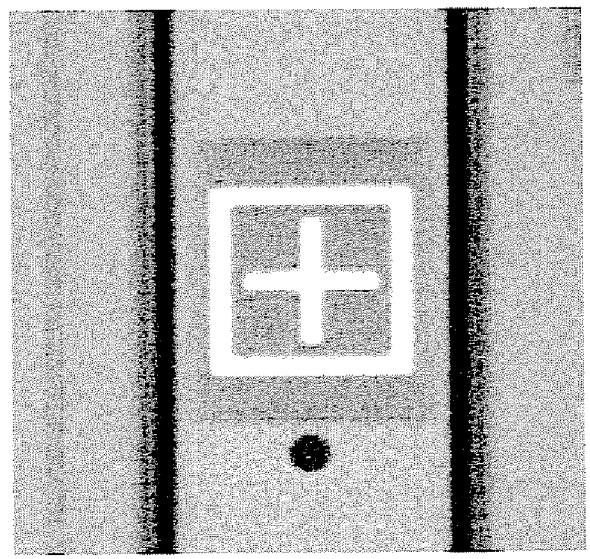
FIGS. 3 to 5 are scanning electron microscope (SEM) pictures illustrating various alignment marks.
Figure 4:
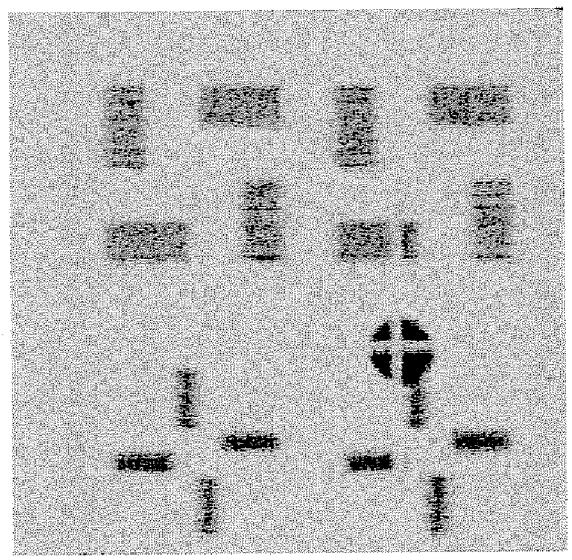
Figure 5:
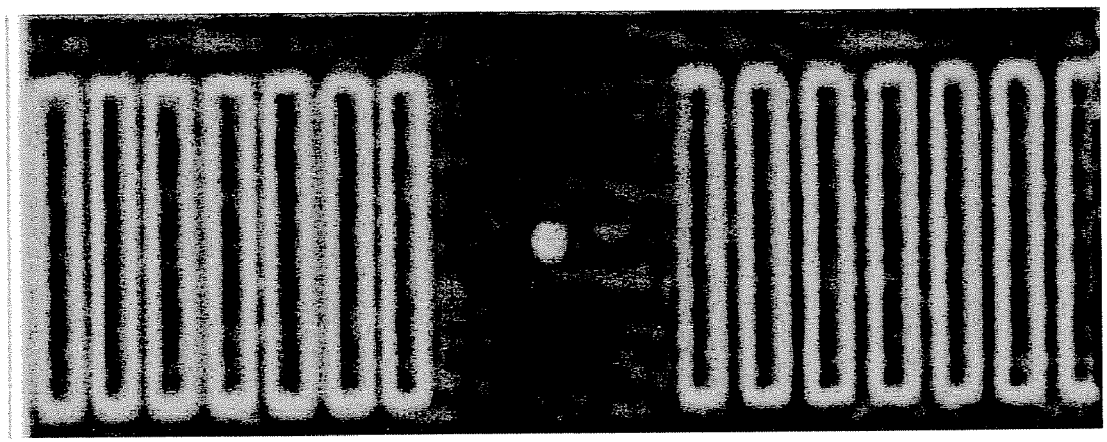

FIG. 1 is a block diagram illustrating an apparatus for aligning a substrate in accordance with some embodiments of the present invention, FIG. 2 is a plan view illustrating a substrate on which positions of alignment marks are displayed, and FIGS. 3 to 5 are scanning electron microscopic (SEM) pictures illustrating various alignment marks.

Referring to FIGS. 1 and 2, an apparatus 100 for aligning a substrate in accordance with an embodiment may include an identifying unit 110, a determining unit 120 and an aligning unit 130.

The identifying unit 110 may be arranged over a stage on which the substrate W may be placed. The substrate W may be divided into a plurality of shot regions. At least two alignment marks three alignment marks may be formed in each of the shot regions. The identifying unit 110 may identify the at least two alignment marks in each of the shot regions. Further, coordinates of the alignment marks may be input into the identifying unit 110. Thus, the identifying unit 110 may identify the alignment marks in accordance with whether the alignment marks may be located on the inputted coordinates, respectively.

In this embodiment, the identifying unit 110 may previously identify a first alignment mark M1 in a first shot region S1. When the first alignment mark M1 may not be identified, the identifying unit 110 may identify a second alignment mark M2 in the first shot region S1. When the second alignment mark M2 may not be identified, the identifying unit 110 may identify a third alignment mark M3 in the first shot region S1.

When any one of the first alignment mark M1, the second alignment mark M2 and the third alignment mark M3 may be identified, the identifying unit 110 may then identify a fourth alignment mark M4 in a second shot region S2 that may be located from the first shot region S1 in a first direction. When the fourth alignment mark M4 may not be identified, the identifying unit 110 may identify a fifth alignment mark M5 in the second shot region S2. When the fifth alignment mark M5 may not be identified, the identifying unit 110 may identify a sixth alignment mark M6 in the second shot region S2.

When any one of the fourth alignment mark M4, the fifth alignment mark M5 and the sixth alignment mark M6 may be identified, the identifying unit 110 may then identify a seventh alignment mark M7 in a third shot region S3 that may be located from the first shot region S1 in a second direction substantially perpendicular to the first direction. When the seventh alignment mark M7 may not be identified, the identifying unit 110 may identify an eighth alignment mark M8 in the third shot region S3. When the eighth alignment mark M8 may not be identified, the identifying unit 110 may identify a ninth alignment mark M9 in the third shot region S3.

Here, as shown in FIGS. 3 to 5, the first alignment mark M1, the second alignment mark M2, the third alignment mark M3, the fourth alignment mark M4, the fifth alignment mark M5, the sixth alignment mark M6, the seventh alignment mark M7, the eighth alignment mark M8 and the ninth alignment mark M9 may have various shapes. For example, the first alignment mark M1, the second alignment mark M2, the third alignment mark M3, the fourth alignment mark M4, the fifth alignment mark M5, the sixth alignment mark M6, the seventh alignment mark M7, the eighth alignment mark M8 and the ninth alignment mark M9 may have only any one of the shapes in FIGS. 3 to 5. In this case, the first alignment mark M1, the second alignment mark M2, the third alignment mark M3, the fourth alignment mark M4, the fifth alignment mark M5, the sixth alignment mark M6, the seventh alignment mark M7, the eighth alignment mark M8 and the ninth alignment mark M9 may have substantially the same shape. Alternatively, the first alignment mark M1, the second alignment mark M2, the third alignment mark M3, the fourth alignment mark M4, the fifth alignment mark M5, the sixth alignment mark M6, the seventh alignment mark M7, the eighth alignment mark M8 and the ninth alignment mark M9 may selectively have any one of the shapes in FIGS. 3 to 5. In this case, the first alignment mark M1, the second alignment mark M2, the third alignment mark M3, the fourth alignment mark M4, the fifth alignment mark M5, the sixth alignment mark M6, the seventh alignment mark M7, the eighth alignment mark M8 and the ninth alignment mark M9 may have different shapes. Particularly, the first alignment mark M1, the fourth alignment mark M4 and the seventh alignment mark M7 may have the shape in FIG. 3. The second alignment mark M2, the fifth alignment mark M5 and the eighth alignment mark M8 may have the shape in FIG. 4. The third alignment mark M3, the sixth alignment mark M6 and the ninth alignment mark M9 may have the shape in FIG. 5.

Further, in this embodiment, the identifying unit 110 may sequentially identify the three alignment marks in the single shot region. Alternatively, the identifying unit 110 may identify two, four or more alignment marks in the single shot region.

Furthermore, the identifying unit 110 may include a displaying member 112 for displaying alignment scores that may numerically represent alignment states of the alignment marks. The displaying member 112 may really display the alignment scores of the alignment marks as the identifying unit 110 identifies the alignment marks. Therefore, an inspector may recognize at once the alignment states of the alignment marks by the alignment scores displayed on the displaying member 112. Here, the alignment score may correspond to a value that may indicate an identification degree of the shape of the alignment mark by the identifying unit 110. Thus, the clearer the alignment mark may be, the higher the alignment scores may be displayed on the displaying member 112.

The determining unit 120 may determine whether the alignment marks may be normally aligned or not in accordance with the alignment scores. Thus, the determining unit 120 may include an inputting member 122 for setting an allowable alignment score as a standard that may be used for determining whether the alignment marks may be normally aligned or not. Further, a final allowable alignment score for finally determining whether the alignment marks may be normally aligned or not may be set through the inputting member 122. Here, the final allowable alignment score may be lower than the allowable alignment score.

When the allowable alignment score may be too high, numerous substrates may be determined to be abnormally aligned due to obscurity of the alignment mark, although the obscure alignment mark may be accurately aligned. In contrast, when the allowable alignment score may be too low, abnormally aligned substrates may be determined to be normally aligned. Therefore, the allowable alignment score may be optimally determined by alignments tests with respect to the substrates.

Further, patterns, which may have shapes substantially similar to those of the alignment marks may be formed on the substrate. Particularly, the patterns may be arranged adjacent to the alignment marks. In this case, the identifying unit 110 may identify the patterns, not the alignment mark. Because the shape of the pattern may not be identical to that of the alignment mark, although substantially similar to that of the alignment mark, an alignment score of the pattern may be lower than that of the alignment mark.

In order to determine the accurately aligned substrate having the obscure alignment mark to be normally aligned and the identification of the pattern to be abnormal, the final allowable alignment score may be used. In this embodiment, the alignment score of the obscure alignment mark may be lower than the allowable alignment score. Thus, the determining unit 120 may determine the obscure alignment mark to be abnormally aligned in advance. The alignment scores of the obscure alignment mark and the pattern may be continuously identified with the allowable alignment score being changed in a descending order from the previous allowable alignment through the inputting member 112. An alignment score, which may allow the determining unit 120 to determine the accurately aligned substrate having the obscure alignment mark to be normally aligned and the identification of the pattern to be abnormal, may be identified, because the alignment score of the obscure alignment mark may be higher than that of the pattern. This alignment score may be set as the final allowable alignment score. The final allowable alignment score may be optimally determined by the aligning processes with respect to the substrates similarly to the allowable alignment score.

The aligning unit 130 may move the stage to align the alignment marks with the predetermined coordinates, respectively, in accordance with the determination results of the determining unit 120. Thus, the aligning unit 130 may include a horizontal driving member 132 for horizontally moving the stage.

Here, the alignment marks may have different heights. When a distance between the stage and the identifying unit 110 may be uniform, the identifying unit 110 may not identify the alignment mark due to defocus between the identifying unit 110 and the alignment mark. Therefore, in order to focus the identifying unit 110 and the alignment mark with each other, the aligning unit 130 may further include a vertical driving member 134 for vertically moving the stage.

Method of Aligning a Substrate

Figure 6:
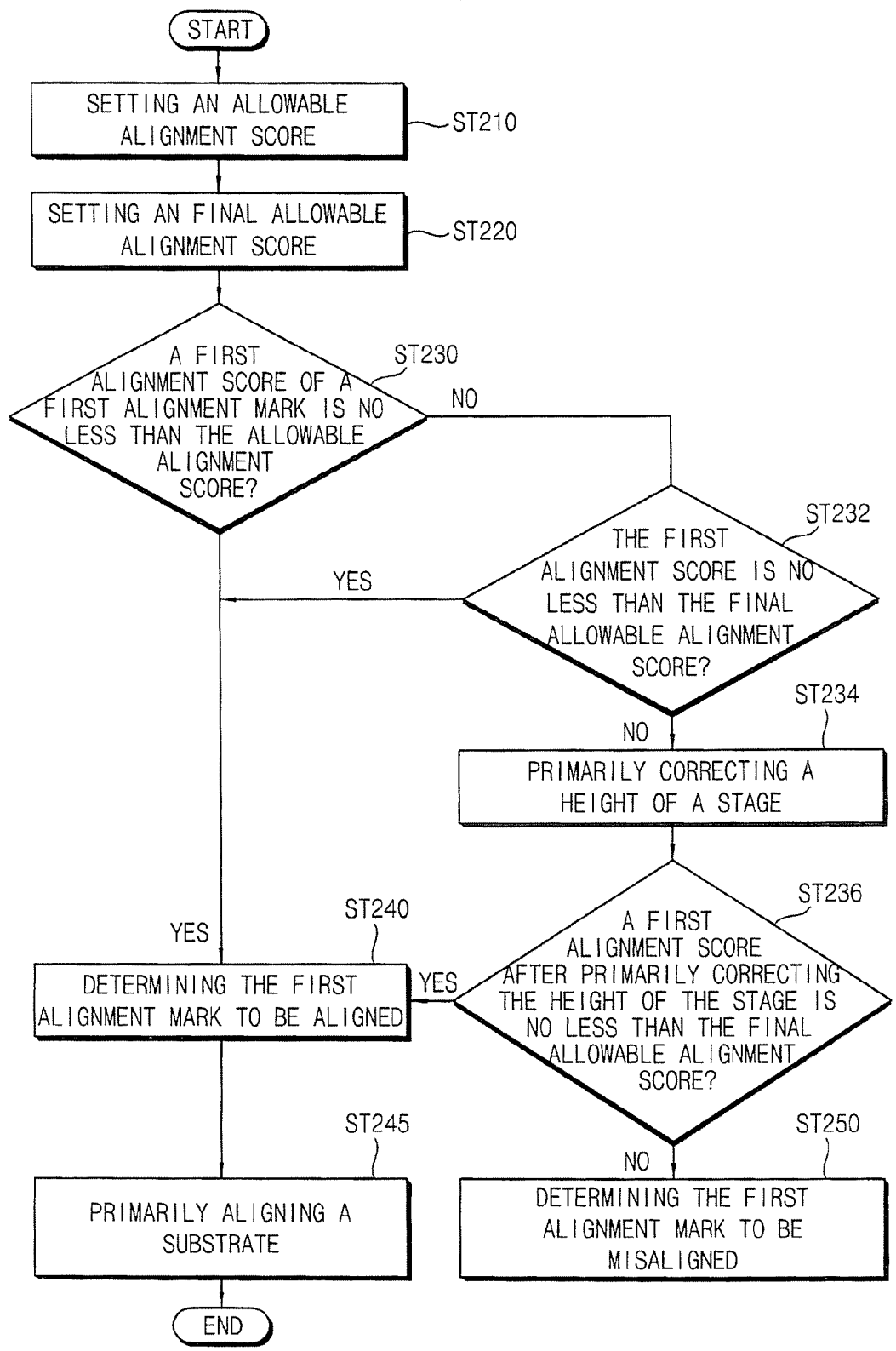
FIGS. 6 to 9 are flow charts illustrating a method of aligning first, second and third alignment marks in a first shot region on a substrate using the apparatus in FIG. 1.
Figure 7:
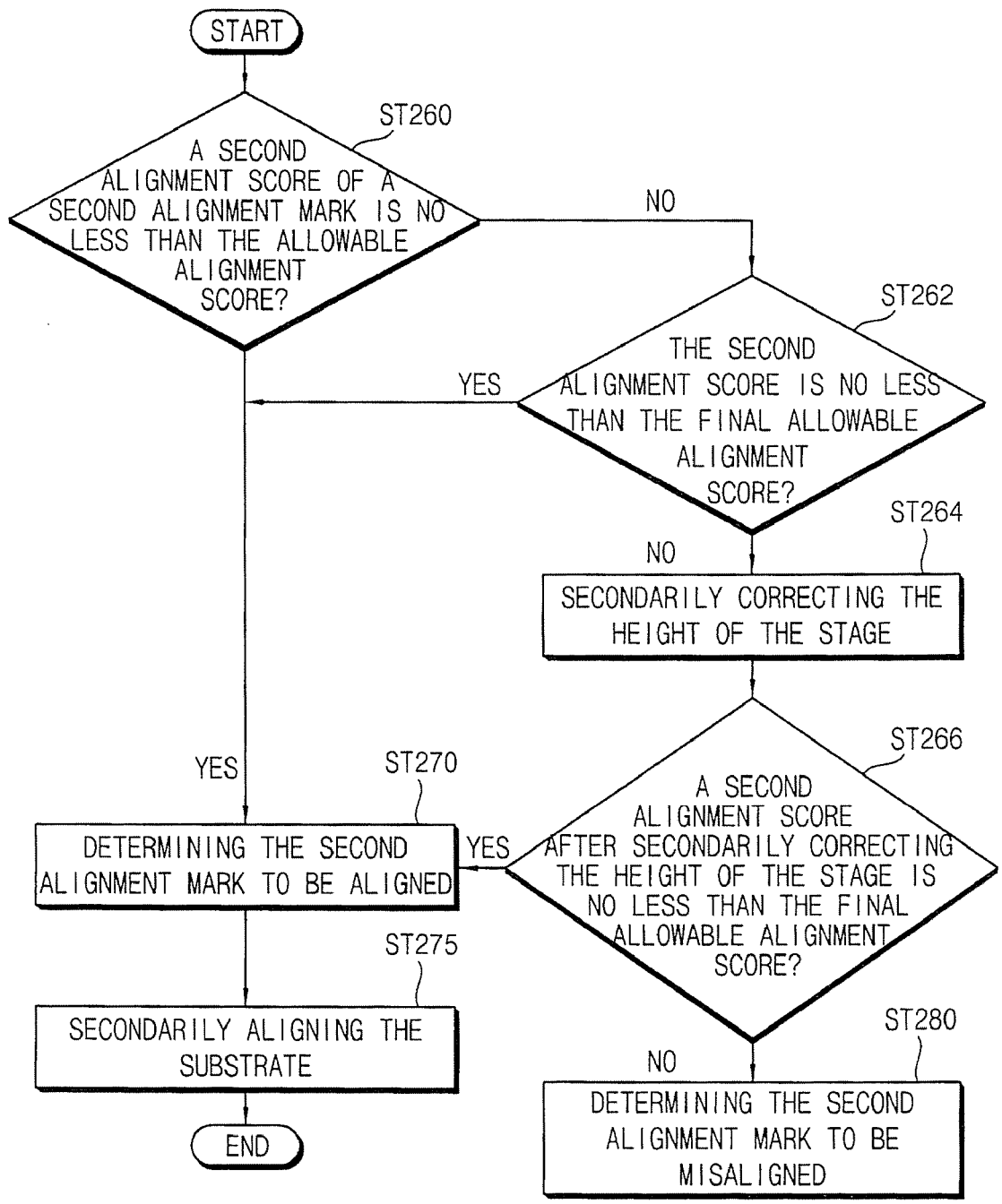
Figure 8:
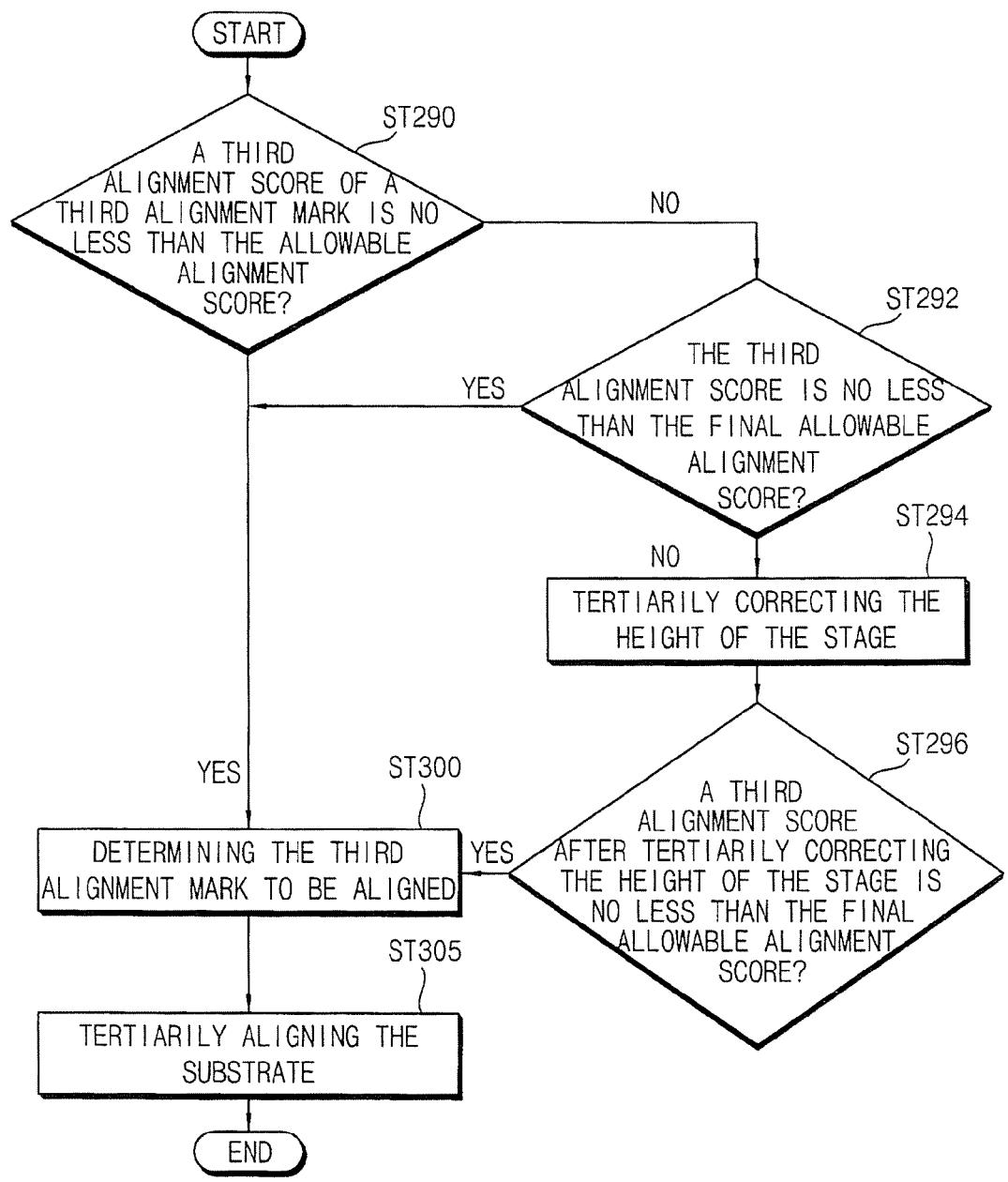
Figure 9:
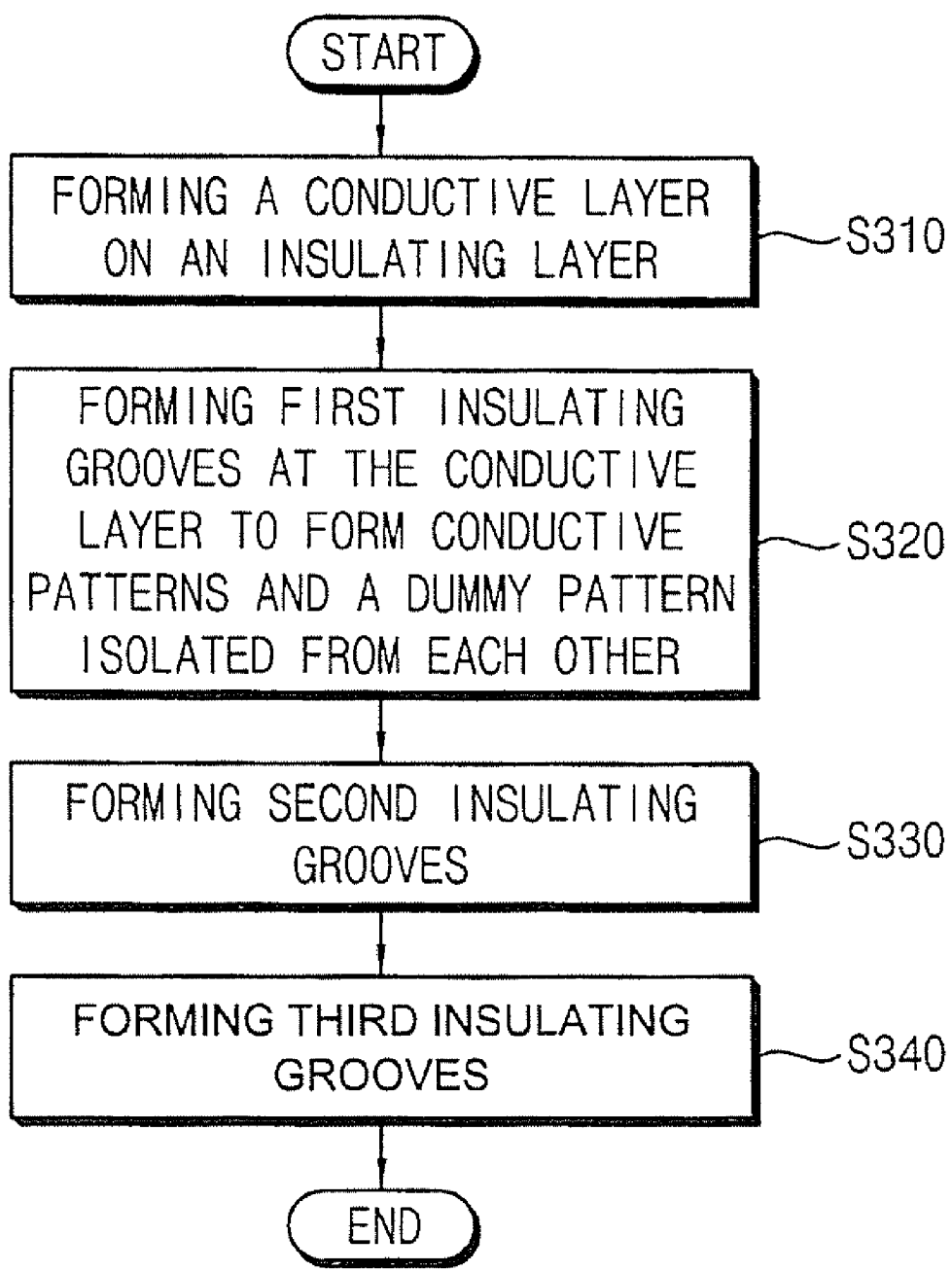

FIGS. 6 to 8 are flow charts illustrating a method of aligning first, second and third alignment marks in a first shot region on a substrate using the apparatus in FIG. 1.

Referring to FIGS. 1 to 8, in step ST210, an allowable alignment score may be set in the determining unit 120 through the inputting member 122.

In step ST220, a final allowable alignment score may be set in the determining unit 120 through the inputting member 122.

Here, when the first alignment mark M1, the second alignment mark M2, the third alignment mark M3, the fourth alignment mark M4, the fifth alignment mark M5, the sixth alignment mark M6, the seventh alignment mark M7, the eighth alignment mark M8 and the ninth alignment mark M9 may have substantially the same shape, one allowable alignment score and one final allowable alignment score may be set in the determining unit 120.

In contrast, the first alignment mark M1, the second alignment mark M2, the third alignment mark M3, the fourth alignment mark M4, the fifth alignment mark M5, the sixth alignment mark M6, the seventh alignment mark M7, the eighth alignment mark M8 and the ninth alignment mark M9 may have different shapes. For example, the first alignment mark M1, the fourth alignment mark M4 and the seventh alignment mark M7 may have the shape in FIG. 3. The second alignment mark M2, the fifth alignment mark M5 and the eighth alignment mark M8 may have the shape in FIG. 4. The third alignment mark M3, the sixth alignment mark M6 and the ninth alignment mark M9 may have the shape in FIG. 5. In these cases, three allowable alignment score and three allowable alignment score, which may correspond to the shapes in FIGS. 3 to 5, respectively, may be set in the determining unit 120. In this embodiment, the first alignment mark M1, the second alignment mark M2, the third alignment mark M3, the fourth alignment mark M4, the fifth alignment mark M5, the sixth alignment mark M6, the seventh alignment mark M7, the eighth alignment mark M8 and the ninth alignment mark M9 may have substantially the same shape.

In step ST230, the identifying unit 110 may identify the first alignment mark M1 in the first shot region S1. Particularly, the identifying unit 110 may identify whether the first alignment score of the first alignment mark M1 may be no less than the allowable alignment score or not. When the first alignment score may be no less than the allowable alignment score, in step ST240, the determining unit 120 may determine identification of the first alignment mark M1.

In contrast, when the first alignment mark M1 may be below the allowable alignment score, in step ST232, the identifying unit 110 may identify whether the first alignment score may be no less than the final allowable alignment score or not. When the first alignment score may be no less than the final allowable alignment score, in step ST240, the determining unit 120 may determine identification of the first alignment mark M1.

However, when the first alignment score may be below the final allowable alignment score, in step ST234, the vertical driving member 134 of the aligning unit 130 may selectively move the stage in an upward direction or in a downward direction to align a focus of the identifying unit 110 with a focus of the first alignment mark M1.

After moving the stage, in step ST236, the identifying unit 110 may finally identify whether the first alignment score may be no less than the final allowable alignment score or not. When the first alignment score may be no less than the final allowable alignment score, in step ST240, the determining unit 120 may finally determine identification of the first alignment mark M1. Therefore, an obscure alignment mark may be determined to be identified and a pattern, which may have a shape substantially similar to that of an alignment mark, may also be determined to be not identified by the step ST240.

In step ST245, the horizontal driving member 132 of the aligning unit 130 may horizontally move the stage to align the identified first alignment mark M1 with a predetermined coordinate, thereby aligning the substrate.

In contrast, when the first alignment score may be below the final allowable alignment score, in step ST250, the determining unit 120 may finally determine non-identification of the first alignment mark M1 (i.e., the first alignment mark M1 is misaligned).

When the first alignment mark M1 may be finally determined to be not identified, in step ST260, the identifying unit 110 may identify whether the second alignment score of the second alignment mark M2 in the first shot region S1 may be no less than the allowable alignment score or not. When the second alignment score may be no less than the allowable alignment score, in step ST270, the determining unit 120 may determine identification of the second alignment mark M2.

In contrast, when the second alignment score may be below the allowable alignment score, in step ST262, the identifying unit 110 may identify whether the second alignment score may be no less than the final allowable alignment score or not. When the second alignment score may be no less than the final allowable alignment score, in step ST270, the determining unit 120 may determine identification of the second alignment mark M2.

However, when the second alignment score may be below the final allowable alignment score, in step ST264, the vertical driving member 134 of the aligning unit 130 may selectively move the stage in the upward direction or in the downward direction to align the focus of the identifying unit 110 with a focus of the second alignment mark M2.

After moving the stage, in step ST266, the identifying unit 110 may finally identify whether the second alignment score may be no less than the final allowable alignment score or not. When the second alignment score may be no less than the final allowable alignment score, in step ST270, the determining unit 120 may determine identification of the second alignment mark M2 (i.e., the second alignment mark is aligned).

In step ST275, the horizontal driving member 132 of the aligning unit 130 may horizontally move the stage to align the identified second alignment mark M2 with a predetermined coordinate, thereby aligning the substrate.

In contrast, when the second alignment score may be below the final allowable alignment score, in step ST280, the determining unit 120 may finally determine non-identification of the second alignment mark M2 (i.e., the second alignment mark M2 is misaligned).

When the second alignment mark M2 may be finally determined to be not identified, in step ST290, the identifying unit 110 may identify whether the third alignment score of the third alignment mark M3 in the first shot region S1 may be no less than the allowable alignment score or not. When the third alignment score may be no less than the allowable alignment score, in step ST300, the determining unit 120 may determine identification of the third alignment mark M3 (i.e., the third alignment mark M3 is aligned).

In contrast, when the third alignment score may be below the allowable alignment score, in step ST292, the identifying unit 110 may identify whether the third alignment score may be no less than the final allowable alignment score or not. When the third alignment score may be no less than the final allowable alignment score, in step ST300, the determining unit 120 may determine identification of the third alignment mark M3.

However, when the third alignment score may be below the final allowable alignment score, in step ST294, the vertical driving member 134 of the aligning unit 130 may selectively move the stage in the upward direction or in the downward direction to align the focus of the identifying unit 110 with a focus of the third alignment mark M3.

After moving the stage, in step ST296, the identifying unit 110 may finally identify whether the third alignment score may be no less than the final allowable alignment score or not. When the third alignment score may be no less than the final allowable alignment score, in step ST300, the determining unit 120 may determine identification of the third alignment mark M3.

In step ST305, the horizontal driving member 132 of the aligning unit 130 may horizontally move the stage to align the identified third alignment mark M3 with a predetermined coordinate, thereby aligning the substrate.

The displaying member 112 may continuously display the first alignment score of the first alignment mark M1, the second alignment score of the second alignment mark M2 and the third alignment score of the third alignment mark M3.

Here, in this embodiment, the alignment of the first shot region S1 may be completed by the identification of the third alignment mark M3. However, when the third alignment mark M3 may not be identified, the identifying unit 110 may be moved over other alignment marks in the first shot region S1. The identifying unit 110 may additionally identify other alignment marks. Thus, when the substrate may be accurately aligned, the determining unit 120 may not determine the accurately aligned substrate to be misaligned.

When completing the alignment of the first shot region S1, processes substantially the same as those performed on the first alignment mark M1, the second alignment mark M2 and the third alignment mark M3 in the first shot region S1 may be performed on the fourth alignment mark M4, the fifth alignment mark M5 and the sixth alignment mark M6 in the second shot region S2 to secondarily align the substrate.

When completing the alignment of the second shot region S2, processes substantially the same as those performed on the first alignment mark M1, the second alignment mark M2 and the third alignment mark M3 in the first shot region S1 may be performed on the seventh alignment mark M7, the eighth alignment mark M8 and the ninth alignment mark M9 in the third shot region S3 to tertiarily align the substrate.

The processes performed on the on the fourth alignment mark M4, the fifth alignment mark M5 and the sixth alignment mark M6 in the second shot region S2, and the seventh alignment mark M7, the eighth alignment mark M8 and the ninth alignment mark M9 in the third shot region S3 may be substantially the same as those performed on the first alignment mark M1, the second alignment mark M2 and the third alignment mark M3 in the first shot region S1. Thus, any further illustrations with respect to the processes may be omitted herein for brevity.

According to some embodiments of the present invention, when the first alignment mark in the shot region may not be identified, the second alignment mark in the shot region may then be identified. Thus, although the substrate may be accurately aligned, the accurately aligned substrate may not be determined to be misaligned. Further, because the misalignment may be determined based on the two allowable alignment scores, an obscure alignment mark may not be determined to be misaligned. As a result, the accurately aligned substrate having the obscure alignment mark may be determined to be aligned, so that a time for aligning the substrate may be greatly reduced, thereby improving a yield of a semiconductor device.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific example embodiments disclosed, and that modifications to the disclosed example embodiments, as well as other example embodiments, are intended to be included within the scope of the appended claims. The present invention is defined by the following claims, with equivalents of the claims to be included therein.

What is claimed is:

1. A method of aligning a substrate, the method comprising:
    setting an allowable alignment score that is used for determining non-identifications of a first alignment mark and a second alignment mark in one shot region of the substrate;
    setting a final allowable alignment score that is used for finally determining the non-identifications of the first alignment mark and the second alignment mark, the final allowable alignment score lower than the allowable alignment score;
    identifying the first alignment mark to obtain a first alignment score of the first alignment mark;
    comparing the first alignment score with the allowable alignment score;
    comparing the first alignment score with the final allowable alignment score, when the first alignment score is below the allowable alignment score;
    correcting a height of the substrate;
    comparing a first alignment score after correcting the height of the substrate with the final allowable alignment score;
    selectively identifying the second alignment mark to obtain a second alignment score of the second alignment mark, when the first alignment score is below the final allowable alignment score;
    comparing the second alignment score with the allowable alignment score;
    comparing the second alignment score with the final allowable alignment score, when the second alignment score is below the allowable alignment score;
    correcting the height of the substrate;
    comparing a second alignment score after correcting the height of the substrate with the final allowable alignment score; and
    aligning the substrate using the first alignment mark or the second alignment mark.

2. The method of claim 1, wherein setting the final allowable alignment score comprises changing an alignment score in a descending order from the allowable alignment score to the final allowable alignment score.

3. The method of claim 1, wherein the first alignment mark and the second alignment mark have substantially the same shape.

4. The method of claim 1, wherein the first alignment mark and the second alignment mark have different shapes.

5. A method of aligning a substrate, the method comprising:
    identifying any one of a first alignment mark and a second alignment mark in a first shot region of the substrate;
    aligning the substrate using any one of the identified first alignment mark and the second alignment mark;
    identifying any one of a third alignment mark and a fourth alignment mark in a second shot region that is located from the first shot region in a first direction;
    aligning the substrate using any one of the identified third alignment mark and the fourth alignment mark;
    identifying any one of a fifth alignment mark and a sixth alignment mark in a third shot region that is located from the first shot region in a second direction substantially perpendicular to the first direction; and
    aligning the substrate using any one of the fifth identified alignment mark and the sixth alignment mark.

6. The method of claim 5, wherein identifying the first alignment mark, the second alignment mark, the third alignment mark, the fourth alignment mark, the fifth alignment mark and the sixth alignment mark comprises:
    setting an allowable alignment score that is used for determining non-identifications of the first alignment mark, the third alignment mark and the fifth alignment mark;
    setting a final allowable alignment score that is used for finally determining the non-identifications of the first alignment mark, the third alignment mark and the fifth alignment mark, the final allowable alignment score lower than the allowable alignment score;
    comparing a first alignment score of the first alignment mark, a third alignment score of the third alignment mark and a fifth alignment score of the fifth alignment mark with the allowable alignment score;

comparing the first alignment score, the third alignment score and the fifth alignment score with the final allowable alignment score, when the first alignment score, the third alignment score and the fifth alignment score are below the allowable alignment score;

correcting a height of the substrate;

comparing a first alignment score, a third alignment score and a fifth alignment score after primarily correcting the height of the substrate with the final allowable alignment score;

comparing a second alignment score of the second alignment mark, a fourth alignment score of the fourth alignment mark and a sixth alignment score of the sixth alignment mark with the allowable alignment score, when the first alignment score, the third alignment score and the fifth alignment score are below the final allowable alignment score;

comparing the second alignment score, the fourth alignment score and the sixth alignment score with the final allowable alignment score, when the second alignment score, the fourth alignment score and the sixth alignment score are below the allowable alignment score;

correcting the height of the substrate; and comparing a second alignment score, a fourth alignment score and a sixth alignment score after correcting the height of the substrate with the final allowable alignment score.

7. The method of claim 6, wherein setting the final allowable alignment score comprises changing an alignment score in a descending order from the allowable alignment score to the final allowable alignment score.

8. The method of claim 5, wherein the first alignment mark, the second alignment mark, the third alignment mark, the fourth alignment mark, the fifth alignment mark and the sixth alignment mark have substantially the same shape.

9. The method of claim 5, wherein the first alignment mark, the second alignment mark, the third alignment mark, the fourth alignment mark, the fifth alignment mark and the sixth alignment mark have different shapes.

* * * * *